(12) United States Patent
Kobayashi et al.

(10) Patent No.: US 6,469,551 B2
(45) Date of Patent: *Oct. 22, 2002

(54) STARTING CIRCUIT FOR INTEGRATED CIRCUIT DEVICE

(75) Inventors: Isamu Kobayashi, Kasugai (JP);
Hiroyuki Sugamoto, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/444,504

(22) Filed: Nov. 22, 1999

(65) Prior Publication Data

US 2002/0027460 A1 Mar. 7, 2002

(30) Foreign Application Priority Data

Nov. 27, 1998 (JP) .............................................. 10-336962

(51) Int. Cl.$^7$ ................................................. H03L 7/00
(52) U.S. Cl. ...................................... 327/143; 327/198
(58) Field of Search ................................ 327/142, 143, 327/198, 77, 78, 79, 80, 81

(56) References Cited

U.S. PATENT DOCUMENTS 4,013,902 A * 3/1977 Payne .......................... 327/143

| | | | | |
|---|---|---|---|---|
| 4,551,841 A | * | 11/1985 | Fujita et al. ................... | 377/66 |
| 5,534,804 A | * | 7/1996 | Woo ............................... | 327/143 |
| 5,703,512 A | * | 12/1997 | McClure ........................ | 327/198 |

FOREIGN PATENT DOCUMENTS

| | | | | | |
|---|---|---|---|---|---|
| JP | 404003513 | * | 1/1992 | .................. | 327/143 |
| JP | 405175812 | * | 7/1993 | .................. | 327/143 |
| TW | 280970 | | 7/1996 | | |

OTHER PUBLICATIONS

Office Action from Taiwanese Patent Office dated Jul. 11, 2001.

* cited by examiner

*Primary Examiner*—Tuan T. Lam
(74) *Attorney, Agent, or Firm*—Armstrong, Westerman & Hattori, LLP (57) ABSTRACT

A starting circuit for an integrated circuit (IC) device insures that the IC device is properly initialized before an initialization signal is dropped. The starting circuit, which receives power from high and low potential power supplies, includes a first transistor having a threshold voltage within a known range. The first transistor receives a control voltage generated from the high and low potential power supplies and produces a start (initialization) signal, from the time that the high potential power supply voltage begins to rise to when the control voltage rises to the first transistor threshold voltage. A correction circuit connected to the first transistor adjusts the control voltage in accordance with the threshold voltage of the first transistor.

12 Claims, 4 Drawing Sheets

STARTING CIRCUIT FOR INTEGRATED CIRCUIT DEVICE

BACKGROUND OF THE INVENTION

The present invention relates to a starting circuit, and, more particularly, to a starting circuit which produces a starting signal for initializing an internal circuit in a semiconductor integrated circuit device.

Figure 1:
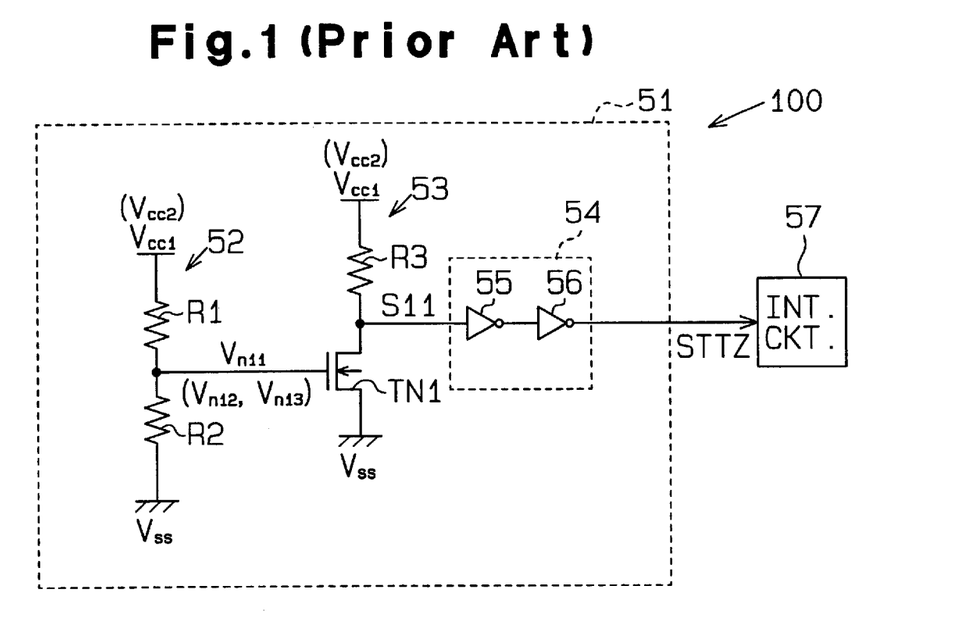
FIG. 1 is a circuit diagram of a conventional starting circuit.

FIG. 1 shows a conventional starting circuit 51 in a semiconductor integrated circuit device 100. The starting circuit 51 receives power from a high potential power supply Vcc1 and a low potential power supply Vss.

The starting circuit 51 comprises a voltage-dividing circuit 52, a first stage section 53 and a waveform shaping circuit 54. The voltage-dividing circuit 52 includes resistors R1 and R2 connected in series between the high potential power supply Vcc1 and the low potential power supply Vss (0 V). The voltage-dividing circuit 52 supplies the first stage section 53 with a voltage Vn11 generated by dividing the high potential power supply voltage Vcc1 in accordance with the ratio of the resistance values of the resistors R1 and R2.

The first stage section 53 includes a resistor R3 and an N-channel MOS transistor (hereinafter simply referred to as an NMOS transistor) TN1 connected in series between the high potential power supply Vcc1 and the low potential power supply Vss. The divided voltage Vn11 is supplied to the gate of the NMOS transistor TN1 and the NMOS transistor TN1 goes on or off according to the level of the divided voltage Vn11. When the NMOS transistor TN1 goes off, the first stage section 53 supplies the waveform shaping circuit 54 with an H level (high potential power supply level) signal S11. When the NMOS transistor TN1 goes on, the first stage section 53 supplies the waveform shaping circuit 54 with an L level (low potential power supply level) signal S11.

The waveform shaping circuit 54 includes a plurality (for example, two) of inverter circuits 55 and 56 connected in series. The first-stage inverter circuit 55 receives the signal S11 from the first stage section 53. The waveform shaping circuit 54 waveform-shapes the signal S11 to produce a starting signal STTZ and supplies it to an internal circuit 57.

Figure 2:
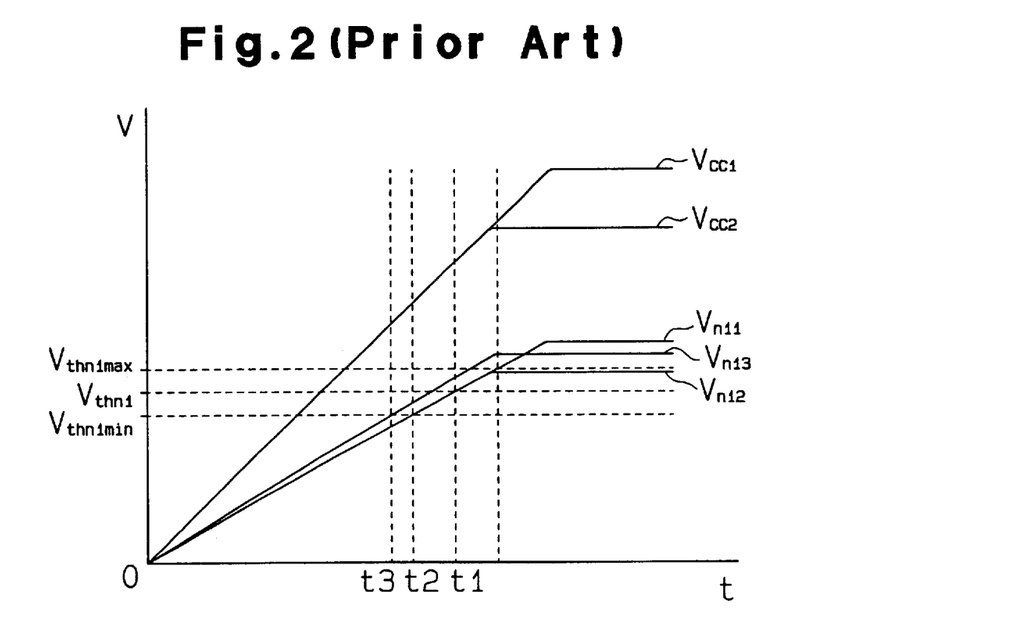
FIG. 2 is a timing chart of each voltage of the starting circuit of FIG. 1.

When the level of the external power supply (high potential power supply Vcc1) supplied to the semiconductor integrated circuit device 100 starts rising from the off state, a current starts flowing in the resistor R3 which forms a constant current source. At this time, the divided voltage Vn11 from the voltage-dividing circuit 52, as shown in FIG. 2, rises in proportion to the rise of the external power supply voltage Vcc1. Because the divided voltage Vn11 does not exceed a threshold voltage Vthn1 of the NMOS transistor TN1 until time t1, the NMOS transistor TN1 is maintained in the off state. Accordingly, the first stage section 53 supplies the H level signal S11 to the waveform shaping circuit 54 and the starting signal STTZ is set at the H level. In response to a high starting signal STTZ, the internal circuit (including a flip-flop circuit and a latch circuit) 57 is initialized.

Further, when the high potential power supply Vcc1 rises and the divided voltage Vn11 exceeds the threshold voltage Vthn1 of the NMOS transistor TN1 after time t1, the NMOS transistor TN1 is turned on. Consequently, the waveform shaping circuit 54 outputs a low starting signal STTZ. The initialization of the internal circuit 57 is completed in response to the trailing edge of the starting signal STTZ.

Subsequently, when the high potential power supply Vcc1 becomes stable at a normal operating voltage (at which the internal circuit 57 operates normally), the starting circuit 51 holds the starting signal STTZ at the L level. Accordingly, unless the high potential power supply Vcc1 falls below a predetermined value again, the internal circuit 57 is not reinitialized. Thus, in the semiconductor integrated circuit device 100, the internal circuit 57 is initialized with the starting signal STTZ of the starting circuit 51 at power-on and malfunctioning of the internal circuit 57 is prevented.

If the time t1 at which the NMOS transistor TN1 goes on is earlier than the time at which the initialization of the internal circuit 57 is normally completed, the internal circuit 57 (i.e., the semiconductor integrated circuit device 100) malfunctions. Accordingly, the ratio of resistance values of the resistors R1 and R2 is set so that the divided voltage Vn11 may exceed the threshold voltage Vthn1 along with the rise of the high potential power supply voltage Vcc1 and the time t1 may be later than the time at which the initialization of the internal circuit 57 is normally completed.

Moreover, the threshold voltage Vthn1 of the NMOS transistor TN1 varies widely in a range from the maximum threshold voltage Vthn1max to the minimum threshold voltage Vthn1min due to unevenness in the chip manufacturing process. Therefore, the ratio of resistance values of the resistors R1 and R2 is set so that the divided voltage Vn11 may exceed the maximum threshold voltage Vthn1max of the NMOS transistor TN1. The time at which the divided voltage Vn11 exceeds the minimum threshold voltage Vthn1min of the NMOS transistor TN1 is defined as t2. The ratio of values of resistance of the resistors R1 and R2 is set so that the time t2 may be later than the time at which the initialization of the internal circuit 57 is normally completed.

In recent years, lower voltage power supplies have been replacing high voltage power supplies, and, as shown in FIG. 2, a high potential power supply Vcc2 having a lower voltage level than the high potential power supply Vcc1 is used as an operating power supply. However, in using the power supply Vcc2, the resistors R1 and R2 having the resistance values set for the high potential power supply Vcc1 are not suitable. Specifically, because a divided voltage Vn12 at which the high potential power supply voltage Vcc2 is divided does not exceed the maximum threshold voltage Vthn1max, the NMOS transistor TN1 does not go on. Accordingly, the starting signal STTZ does not fall to the L level and the initialization of the internal circuit 57 is not completed.

Therefore, the ratio of resistance values of the resistors R1 and R2 is changed so that a divided voltage Vn13 of the power supply Vcc2 may exceed the maximum threshold voltage Vthn1max. Accordingly, the starting circuit 11 can output the L level starting signal STTZ.

However, due to the variation in the ratio of resistance of the resistors R1 and R2, the time t3 at which the divided voltage Vn13 exceeds the minimum threshold voltage Vthn1min is reached more quickly. Accordingly, before the initialization of the internal circuit 57 is normally completed, the starting signal STTZ may fall. In other words, if the time t3 at which the starting signal STTZ falls to the L level is too quick and the initialization of the internal circuit 57 is not completed normally, a malfunction may occur in the semiconductor integrated circuit device 100. Consequently, irrespective of how the ratio of resistance of the resistors R1 and R2 is set, the starting circuit 51 cannot produce the starting signal STTZ which falls at the time at which an arbitrary semiconductor integrated circuit device 100 is normally initialized.

SUMMARY OF THE INVENTION

It is an object of the present invention to provide a starting circuit which produces a starting signal will surely initialize an internal circuit of a semiconductor integrated circuit device.

In one aspect of the present invention, a starting circuit is provided that operates by receiving power from high potential and low potential power supplies. The starting circuit includes a first transistor having a threshold voltage within a predetermined range. The first transistor receives a control voltage generated from the high potential and low potential power supplies and produces a signal from the time when the high potential power supply voltage starts rising to the time when the control voltage rises to the first transistor threshold voltage. A correction circuit is connected to the first transistor and adjusts the control voltage in accordance with the threshold voltage of the first transistor.

In another aspect of the present invention, a starting circuit is provided which operates by receiving power from high potential and low potential power supplies. The starting circuit includes a first transistor having a threshold voltage within a predetermined range. The first transistor receives a control voltage generated from the high potential and low potential power supplies and produces a signal from the time when the high potential power supply voltage starts rising to the time when the control voltage rises to the first transistor threshold voltage. A correction circuit is connected to the first transistor adjusts the control voltage in accordance with the threshold voltage of the first transistor. A voltage-dividing circuit divides the voltage of the high and low potential power supplies and generates the control voltage. The voltage-dividing circuit includes a first plurality of resistors connected in series between the high and low potential power supplies. The control voltage is determined by the ratio of the resistance values of the first plurality of resistors. The correction circuit includes a correction voltage-dividing circuit having a second plurality of resistors connected in series between high potential and low potential power supplies. The ratio of resistance values of the second plurality of resistors differs from the ratio of resistance values of the first plurality of resistors. The correction circuit includes a plurality of switching elements for selecting one of a divided voltage generated by the second plurality of resistors and the divided voltage of the voltage-dividing circuit and supplying the selected divided voltage to the first transistor as the control voltage.

In yet another aspect of the present invention, a semiconductor integrated circuit device is provide that includes a starting circuit which operates by receiving power from high potential and low potential power supplies. The starting circuit includes a first transistor having a threshold voltage within a predetermined range. The first transistor receives a control voltage generated by the high potential and low potential power supplies and generates a signal from the time when the high potential power supply voltage starts rising to and the time when the control voltage rises to the first transistor threshold voltage. A correction circuit is connected to the first transistor and adjusts the control voltage in accordance with the threshold voltage of the first transistor. A Waveform shaping circuit waveform-shapes the signal from the first transistor and generates a starting signal. An internal circuit is connected to the waveform shaping circuit and performs the initialization operation in response to the signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 3:
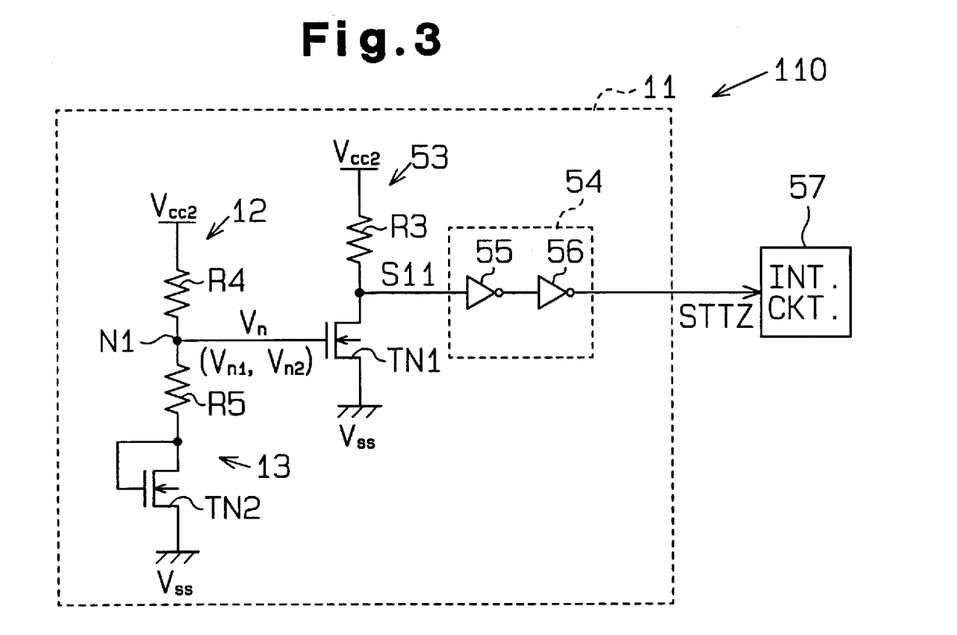
FIG. 3 is a circuit diagram of a starting circuit according to a first embodiment of the present invention.
Figure 4:
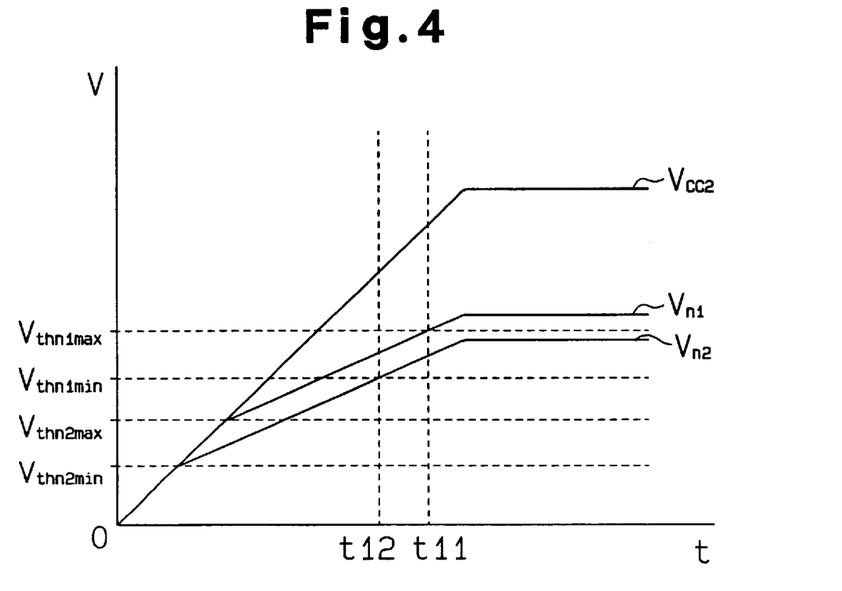
FIG. 4 is a timing chart of each voltage of the starting circuit of FIG. 3.

With reference to FIGS. 3 and 4, a starting circuit 11 of a semiconductor integrated circuit device 110 according to a first embodiment of the present invention is described centered around its differences from the previously discussed conventional starting circuit 51. In the drawings, the same numerals are used for the same elements throughout.

As shown in FIG. 3, the starting circuit 11 comprises a voltage-dividing circuit 12, a first stage section 53 and a waveform shaping circuit 54. The first stage section 53 includes a resistor R3 and an N-channel MOS transistor (hereinafter referred to as a first transistor) TN1 connected in series between a high potential power supply Vcc2 and a low potential power supply Vss (0 V).

The voltage-dividing circuit 12 includes resistors R4 and R5 and a correction circuit 13 connected in series between the high potential power supply Vcc2 and the low potential power supply Vss (0 V). The correction circuit 13 preferably includes an N-channel MOS transistor (hereinafter a second transistor) TN2. The gate and drain of the second transistor TN2 are connected to each other. A node N1 between the resistors R4 and R5 is connected to the gate of the first transistor TN1.

The second transistor TN2 is turned off until its gate voltage (drain voltage) exceeds a threshold voltage Vthn2. The voltage-dividing circuit 12 supplies a divided voltage Vn to the first stage section 53 until the voltage provided by the high potential power supply Vcc2 exceeds the threshold voltage Vthn2 of the second transistor TN2. The voltage-dividing circuit 12 supplies the voltage at the node N1 (the divided voltage Vn) to the first stage section 53 when the high potential power supply voltage Vcc2 exceeds the threshold voltage Vthn2 of the second transistor TN2. The divided voltage Vn is a voltage (Vthn2+{(Vcc2−Vthn2)×

R5/(R4+R5)}) generated by adding the threshold voltage Vthn2 of the second transistor TN2 and a voltage into which the voltage (Vcc2−Vthn2) between the high potential power supply Vcc2 and the drain of the second transistor TN2 is divided according to the ratio of the resistance values of the resistors R4 and R5.

The divided voltage Vn rises quickly to a high value, as the threshold voltage Vthn2 of the second transistor TN2 is relatively large.

The threshold voltage Vthn2 of the second transistor TN2 is set at a lower value than the threshold value Vthn1 of the first transistor TN1. In other words, the gate length of the second transistor TN2 is made shorter than the gate length of the first transistor TN1. Moreover, because the first and second transistors TN1 and TN2 are manufactured using the same process, they have the same electrical characteristics. Accordingly, the threshold voltage Vthn2 of the second transistor TN2 and the threshold voltage Vthn1 of the first transistor TN1 vary in the same manner. Consequently, the correction circuit 13 corrects the divided voltage Vn so that is rises quickly to a high value as the threshold voltage Vthn1 of the first transistor TN1 is relatively large.

Hence, the correction circuit 13 increases the divided voltage Vn by the threshold voltage Vthn2 of the second transistor TN2, which varies in accordance with unevenness in the threshold voltage Vthn1 of the first transistor TN1. That is, the correction circuit 13 adjusts the divided voltage Vn in accordance with the threshold voltage Vthn1 of the first transistor TN1.

The divided voltage Vn is applied to the gate of the first transistor TN1 of the first stage section 53 and the first transistor TN1 turns on or off depending on the divided voltage Vn. The first stage section 53 supplies an H level (high potential power supply level) signal S11 to the waveform shaping circuit 54 when the first transistor TN1 is turned off. Conversely, the first stage section 53 supplies an L level (low potential power supply level) signal S11 to the waveform shaping circuit 54 when the first transistor TN1 is turned on.

The drain of the first transistor TN1 is connected to an inverter circuit 55 of the waveform shaping circuit 54 and the signal S11 from the first stage section 53 is supplied to the inverter circuit 55. The waveform shaping circuit 54 waveform-shapes the signal S11 and supplies a waveform-shaped signal to an internal circuit (including a flip-flop circuit and a latch circuit) 57 as a starting signal STTZ.

Next, with reference to the timing chart of FIG. 4, the operation of the starting circuit 11 is described.

Now, assume the threshold voltage of the first transistor TN1 is the maximum value (maximum threshold voltage) Vthn1max. In this case, the second transistor TN2 also has substantially the maximum threshold voltage (maximum threshold voltage Vthn2max) since they are made using the same process at the same time.

When the external power supply (high potential power supply Vcc2) supplied to the semiconductor integrated circuit device 110 starts rising, a current starts flowing in the resistor R3. Until the high potential power supply voltage Vcc2 exceeds the maximum threshold voltage Vthn2max of the second transistor TN2, the divided voltage Vn1 rises substantially at the same rate as the high potential power supply voltage Vcc2. Subsequently, the divided voltage Vn1 (Vthn2max+{(Vcc2−Vthn2max)×R5/(R4+R5)}) rises at a smaller rate of increase than the high potential power supply Vcc2 in proportion to the rise of the external power supply voltage (high potential power supply voltage Vcc2).

Because the divided voltage Vn1 does not exceed the maximum threshold voltage Vthn1max of the first transistor TN1 up to time t11, the first transistor TN1 is turned off. Accordingly, the first stage section 53 supplies the H level signal S11 to the waveform shaping circuit 54 and the starting signal STTZ is maintained at the H level. The internal circuit 57 is initialized in response to the high starting signal STTZ. Besides, the divided voltage Vn1 is set to a higher potential than the divided voltage Vn due to the resistors R4 and R5 by the maximum threshold voltage Vthn2max of the second transistor TN2. Accordingly, the divided voltage Vn1 is adjusted to exceed the maximum threshold voltage Vthn1max of the first transistor TN1.

When the high potential power supply Vcc2 rises and the divided voltage Vn1 exceeds the maximum threshold voltage Vthn1max of the first transistor TN1, the first transistor TN1 goes on and the starting signal STTZ falls to the L level. The time t11 at which the first transistor TN1 turns on is set later than the time at which the initialization of the internal circuit 57 is completed. The initialization of the internal circuit 57 is completed in response to the trailing edge of the starting signal STTZ. Subsequently, when the high potential power supply Vcc2 becomes stable at a normal operating voltage (at which the internal circuit 57 operates normally), the starting circuit 51 maintains the starting signal STTZ at the L level. Accordingly, unless the high potential power supply Vcc2 falls below a predetermined value, the internal circuit 57 is not initialized again.

Next, regarding the case where the threshold voltage of the first transistor TN1 has the minimum value (minimum threshold voltage) Vthn1min due to the manufacturing process, a change in each voltage is described. In this case, the second transistor TN2 also has the minimum threshold voltage Vthn2min.

When the external power supply (high potential power supply Vcc2) starts rising, the divided voltage Vn2 rises substantially at the same rate as the high potential power supply voltage Vcc2 until the high potential power supply voltage Vcc2 exceeds the minimum threshold voltage Vthn2min of the second transistor TN2. Subsequently, the divided voltage Vn2 (Vthn2min+{(Vcc2−Vthn2min)×R5/(R4+R5)}) rises at a lower rate of increase than the high potential power supply Vcc2 in proportion to the rise of the high potential power supply voltage Vcc2. Because the divided voltage Vn2 does not exceed the minimum threshold voltage Vthn1min of the first transistor TN1 up to time t12, the first transistor TN1 is turned off. Accordingly, the first stage section 53 supplies the H level signal S11 to the waveform shaping circuit 54 and the starting signal STTZ is maintained at the H level. The internal circuit 57 is initialized in response to a starting signal STTZ High. The divided voltage Vn2 is adjusted by the the correction circuit 13 so as to rise to a higher potential than the divided voltage Vn according to the resistors R4 and R5 by the minimum threshold voltage Vthn2min of the second transistor TN2.

When the high potential power supply voltage Vcc2 rises and the divided voltage Vn2 exceeds the minimum threshold voltage Vthn1min of the first transistor TN1, the first transistor TN1 goes on and the starting signal STTZ is set at the L level. The time t12 at which the first transistor TN1 is turned on is set later than the time the initialization of the internal circuit 57 is completed in the same manner as the time t11. The initialization of the internal circuit 57 is completed in response to the trailing edge of the starting signal STTZ. Subsequently, when the high potential power supply Vcc2 becomes stable at a normal operating voltage (at which the internal circuit 57 operates normally), the starting circuit 51 maintains the starting signal STTZ at the L level. Accordingly, the internal circuit 57 is not initialized again unless the high potential power supply Vcc2 falls below a predetermined value. Thus, the internal circuit 57 is initialized by the starting circuit 51 when the power of the semiconductor integrated circuit device 110 is turned on and malfunctioning of the internal circuit 57 (i.e., semiconductor integrated circuit device 110) is prevented.

The divided voltages Vn1 and Vn2 and times t11 and t12 are set according to the ratio of resistance values of the resistors R4 and R5. The ratio of resistance values of the resistors R4 and R5 is set so that the time t11 at which the divided voltage Vn1 exceeds the maximum voltage Vthn1max and the time t12 at which the divided voltage Vn2 exceeds the minimum threshold voltage Vthn1min are later than the time at which the initialization of the internal circuit 57 is normally completed.

As described above, according to the starting circuit 11 of the first embodiment, the threshold voltage Vthn2 of the second transistor TN2 is set lower than the threshold voltage Vthn1 of the first transistor TN1. The threshold voltages Vthn1 and Vthn2 of the first and second transistors TN1 and TN2 have substantially the same electrical characteristics. Accordingly, the divided voltage Vn is automatically adjusted to a high voltage by the threshold voltage Vthn2 of the second transistor TN2. Consequently, even if unevenness occurs in the threshold voltages Vthn1 and Vthn2, the times t11 and t12 at which the divided voltage Vn exceeds the threshold voltages Vthn1 to Vthn1min are set later than the time at which the initialization of the internal circuit 57 is normally completed. Accordingly, even if the external power supply is a relatively low high potential power supply Vcc2, the starting circuit 11 produces the starting signal STTZ in accordance with unevenness of the threshold voltage Vthn1 of the first transistor TN1. As a result, the internal circuit 57 is surely initialized.

Second Embodiment

Figure 5:
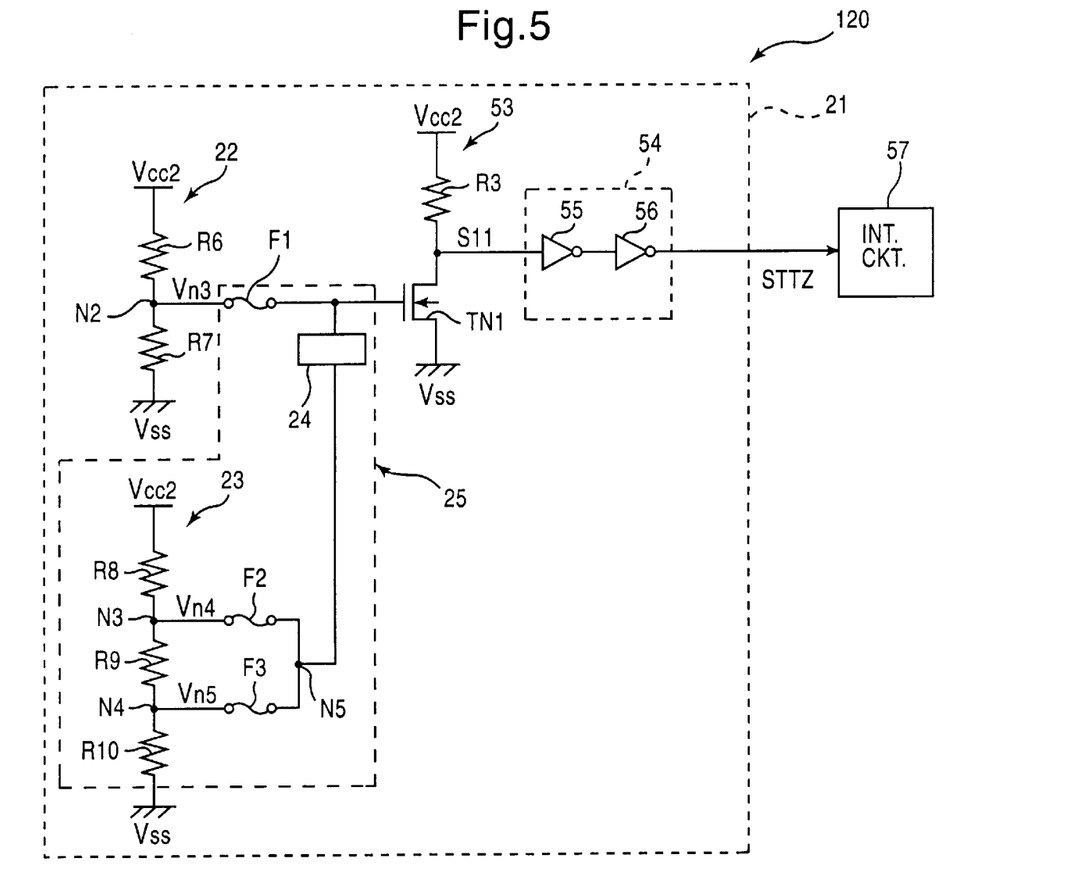
FIG. 5 is a circuit diagram of a starting circuit according to a second embodiment of the present invention.
Figure 6:
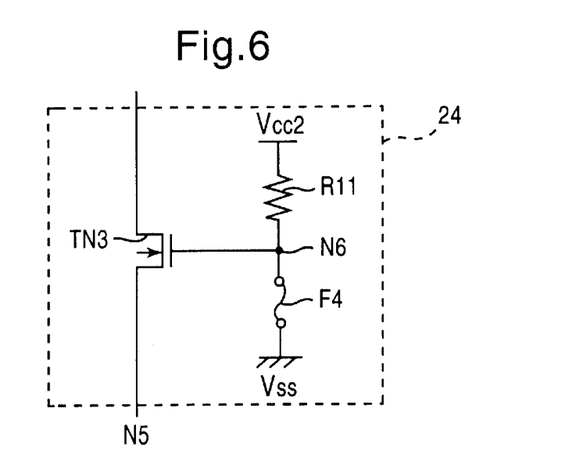
FIG. 6 is a circuit diagram of a switching circuit of the starting circuit of FIG. 5.
Figure 7:
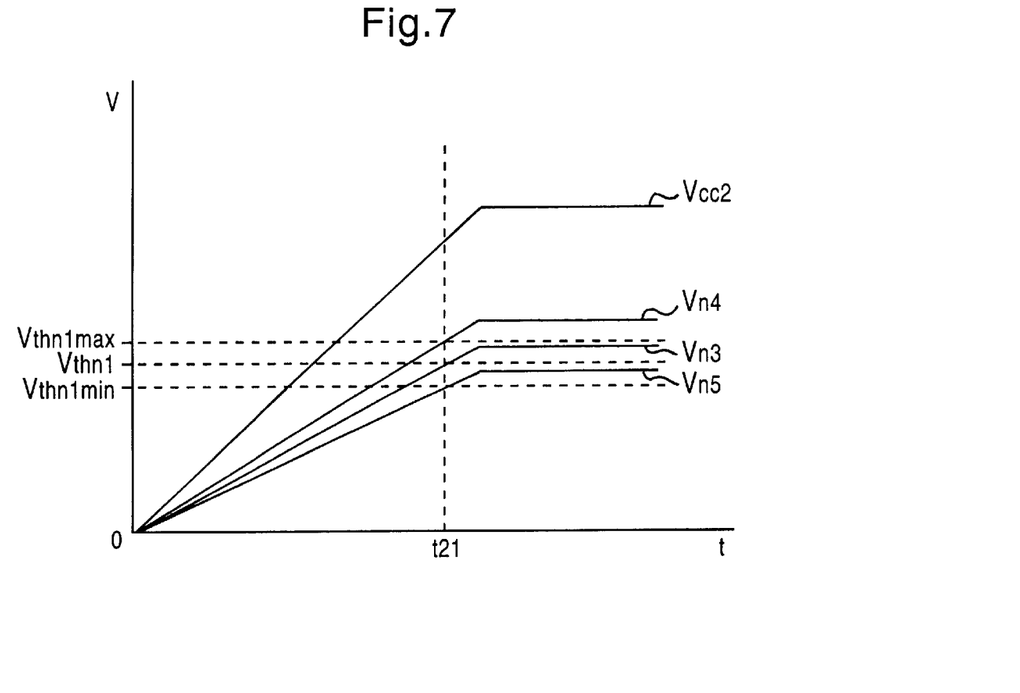
FIG. 7 is a timing chart of each voltage of the starting circuit of FIG. 5.

With reference to FIGS. 5 to 7, a starting circuit 21 according to a second embodiment of the present invention is described below. As shown in FIG. 5, the starting circuit 21 includes a voltage-dividing circuit 22, a correction voltage-dividing circuit 23, a switching circuit 24, a first stage section 53 and a waveform shaping circuit 54.

The voltage-dividing circuit 22 includes resistors R6 and R7 connected in series between a high potential power supply Vcc2 and a low potential power supply Vss (0 V). A node N2 between the resistors R6 and R7 is connected to the gate of a first transistor TN1 of the first stage section 53 via a fuse F1 which functions as a switching element. The voltage-dividing circuit 22 supplies the first stage section 53 with a divided voltage Vn3 at which the high potential power supply voltage Vcc2 is divided according to the ratio of resistance values of the resistors R6 and R7 when the fuse F1 is not broken. When the fuse F1 is broken, the voltage-dividing circuit 22 is not connected with the first stage section 53.

The correction voltage-dividing circuit 23 includes three resistors R8 to R10 connected in series between the high potential power supply Vcc2 and the low potential power supply Vss (0 V). Fuses F2 and F3 which function as switching elements are connected to a node N3 between the resistors R8 and R9 and to a node N4 between the resistors R9 and R10, respectively. The correction voltage-dividing circuit 23 sets the potential of a node N5 between the fuses F2 and F3 to a divided voltage Vn4 (Vcc2×(R9+R10)/(R8+R9+R10)) at which the high potential power supply voltage Vcc2 is divided according to the ratio of resistance values between the resistors R8, R9 and R10 when the fuse F3 is broken. When the fuse F2 is broken, the correction voltage-dividing circuit 23 sets the potential of the node N5 to a divided voltage Vn5 (Vcc2×R10/(R8+R9+R10)) at which the high potential power supply voltage Vcc2 is divided in accordance with the ratio of resistance values between the resistors R8 or R9 and R10. The fuses F1 to F3, the switching circuit 24 and the correction voltage-dividing circuit 23 form a correction circuit 25.

As shown in FIG. 6, the switching circuit 24 includes an NMOS transistor TN3, and a resistor R11 and a fuse F4 connected in series between the high potential power supply Vcc2 and the low potential power supply Vss (0 V). The gate of the NMOS transistor TN3 is connected to a node N6 between the resistor R11 and the fuse F4.

The NMOS transistor TN3 is connected between the node N5 and the gate of the first transistor TN1. The switching circuit 24 sets the potential of the node N6 at the L level (low potential power supply level) when the fuse F4 is not broken. At this time, the NMOS transistor TN3 is turned off and the nonconductive state is set between the node N5 and the gate of the first transistor TN1. Moreover, the switching circuit 24 sets the potential of the node N6 at the H level (high potential power supply level) when the fuse F4 is broken. At this time, the NMOS transistor TN3 is turned on and the nonconductive state is set between the node N5 and the gate of the first transistor TN1. Consequently, the correction voltage-dividing circuit 23 supplies the divided voltage Vn4 to the first stage section 53 when the fuses F1, F3 and F4 are broken. Moreover, the correction voltage-dividing circuit 23 supplies a divided voltage Vn5 to the first stage section 53 when the fuses F1, F2 and F4 are broken. The resistance values of the resistors R6 to R10 are set so that the sizes of the respective divided voltages Vn3, Vn4 and Vn5 are Vn4>Vn3>Vn5.

The first stage section 53 comprises the resistor R3 and the first transistor TN1 connected in series between the high potential power supply Vcc2 and the low potential power supply Vss. Any one of the divided voltages Vn3, Vn4 and Vn5 is supplied to the gate of the first transistor TN1 and the first transistor TN1 goes on or off in response to the divided voltages Vn3, Vn4 and Vn5.

As shown in FIG. 7, time t21 at which the first transistor TN1 goes on is set later than the time at which the initialization of an internal circuit 57 is normally completed. The ratio of resistance values of the resistors R6 and R7 is set so that the divided voltage Vn3 rises to the vicinity of the maximum threshold voltage Vthn1max. Moreover, the ratio of resistance values of the resistors R6 and R7 is set so that the time t21 at which the divided voltage Vn3 exceeds the mean threshold voltage Vthn1 is later than the normal completion timing of the initialization of the internal circuit 57.

The ratio of resistance values between the resistors R8, R9 and R10 is set so that the divided voltage Vn4 will exceed the maximum threshold voltage Vthn1max. The ratio of resistance values between the resistors R8, R9 and R10 is set so that the time t21 at which the divided voltage Vn4 exceeds the maximum threshold voltage Vthn1max is later than the normal completion timing of the initialization of the internal circuit 57.

The ratio of resistance values between the resistors R8, R9 and R10 is set so that the divided voltage Vn5 rise to the vicinity of the mean threshold voltage Vthn1. Moreover, the ratio of resistance values between the resistors R8, R9 and R10 is set so that the time t21 at which the divided voltage Vn5 exceeds the vicinity of the minimum threshold voltage Vthn1max is later than the normal completion timing of the initialization of the internal circuit 57.

Next, with reference to FIG. 7, the change of the divided voltage Vn3 is described for the case where the first transistor TN1 has the mean threshold voltage Vthn1. In this case, the respective fuses F1 to F4 are not broken and the first stage section 53 receives the divided voltage Vn3 from the voltage-dividing circuit 22.

As shown in FIG. 7, when the high potential power supply voltage Vcc2 starts rising, the divided voltage Vn3 rises in proportion to the rise of the high potential power supply voltage Vcc2. Because the divided voltage Vn3 does not exceed the mean threshold voltage Vthn1 of the first transistor TN1 up to the time t21, the first transistor TN1 is turned off. Accordingly, the first stage section 53 supplies an H level signal S11 to the waveform shaping circuit 54 and a starting signal STTZ is set at the H level. The internal circuit 57 is initialized in response to a starting signal STTZ High.

When the high potential power supply Vcc2 rises and the divided voltage Vn3 exceeds the mean threshold voltage Vthn1 of the first transistor TN1, the first transistor TN1 goes on and the starting signal STTZ is set at the L level. The time at which the first transistor TN1 is turned on is substantially the same as the time t21 and is later than the time at which the initialization of the internal circuit 57 is completed. The initialization of the internal circuit 57 is completed in response to the trailing edge of the starting signal STTZ. Subsequently, when the high potential power supply voltage Vcc2 becomes stable at a normal operating voltage (at which the internal circuit 57 operates normally), the starting circuit 21 maintains the starting signal STTZ at the L level.

Next, the change of the divided voltage Vn4 is described for the case where the first transistor TN1 has the maximum threshold voltage Vthn1max. In this case, the fuses F1, F3 and F4 corresponding to the maximum threshold voltage Vthn1max are broken. Accordingly, the divided voltage Vn4 is supplied from the correction voltage-dividing circuit 23 to the first stage section 53.

When the high potential power supply Vcc2 begins to rise, the divided voltage Vn4 rises in proportion to the rise of the high potential power supply voltage Vcc2. Because the divided voltage Vn4 does not exceed the maximum threshold voltage Vthn1max of the first transistor TN1 up to the time t21, the first transistor TN1 is turned off. Accordingly, the first stage section 53 supplies the H level signal S11 to the waveform shaping circuit 54 and the starting signal STTZ is set at the H level. The internal circuit 57 is initialized in response to the starting signal STTZ High.

When the high potential power supply Vcc2 rises further and the divided voltage Vn4 exceeds the maximum threshold voltage Vthn1max of the first transistor TN1, the first transistor TN1 goes on and the starting signal STTZ is set at the L level. The time at which the first transistor TN1 goes on is substantially the same as the time t21 and is later than the time at which the initialization of the internal circuit 57 is completed. The initialization of the internal circuit 57 is completed in response to the trailing edge of the starting signal STTZ. Subsequently, when the high potential power supply voltage Vcc2 becomes stable at a normal operating voltage (at which the internal circuit 57 operates normally), the starting circuit 21 holds the starting signal STTZ at the L level.

Next, the change of the divided voltage Vn5 is described for the case where the first transistor TN1 has the minimum threshold voltage Vthn1min. In this case, the fuses F1, F2 and F4 corresponding to the minimum threshold voltage Vthn1min are broken. Accordingly, the divided voltage Vn5 is supplied from the correction voltage-dividing circuit 23 to the first stage section 53.

When the high potential power supply Vcc2 begins to rise, the divided voltage Vn5 rises in proportion to the rise of the high potential power supply voltage Vcc2. Because the divided voltage Vn5 does not exceed the minimum threshold voltage Vthn1min of the first transistor TN1, the first transistor TN1 is turned off. Accordingly, the first stage section 53 supplies the H level signal S11 to the waveform shaping circuit 54 and the starting signal STTZ is set at the H level. The initial circuit 57 is initialized in response to the starting signal STTZ.

When the high potential power supply Vcc2 rises further and the divided voltage Vn4 exceeds the minimum threshold voltage Vthn1min of the first transistor TN1, the transistor TN1 goes on and the starting signal STTZ is set at the L level. The initialization of the internal circuit 57 is completed in response to the trailing edge of the starting signal STTZ.

As discussed above, according to the starting circuit 21 of the second embodiment, when the fuses F1 to F4 corresponding to the threshold voltage Vthn1 of the first transistor TN1 are broken, the ratio of the resistance value of the correction voltage-dividing circuit 23 is easily changed corresponding to the threshold voltage Vthn1. Accordingly, the gate voltage of the first transistor TN1 is surely set higher than the threshold voltage of the first transistor TN1. As a result, the starting circuit 21 produces the starting signal STTZ in accordance with unevenness in the threshold voltage of the first transistor TN1 even for a low high potential power supply Vcc2.

Third Embodiment

Figure 8:
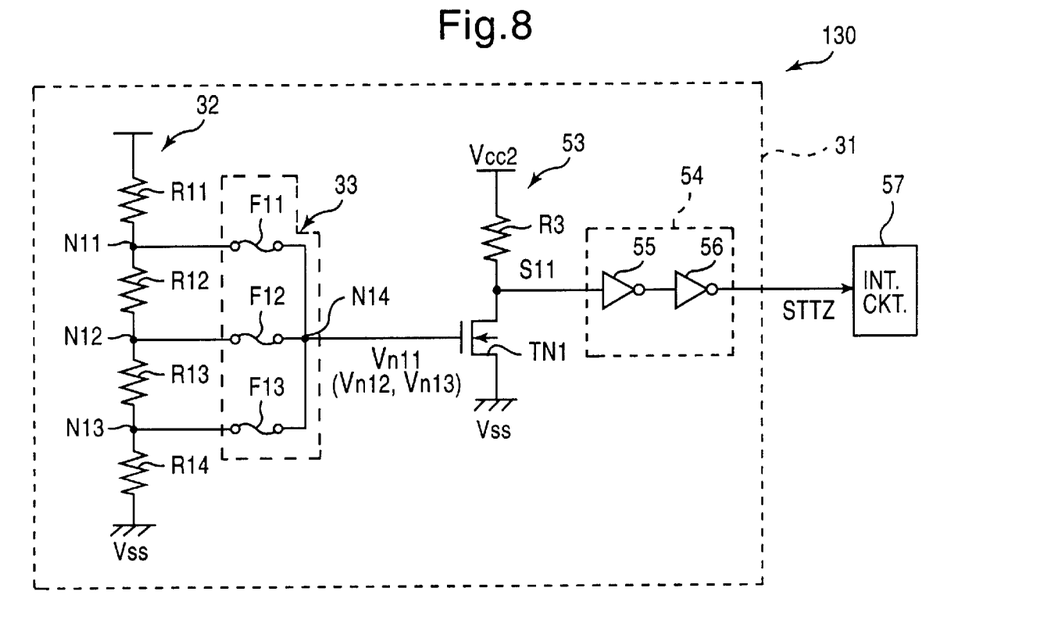
FIG. 8 is a circuit diagram of a starting circuit according to a third embodiment of the present invention.

With reference to FIG. 8, a starting circuit 31 of a third embodiment of the present invention is described below. The starting circuit 31 of the second embodiment differs from the conventional starting circuit 51 in the configuration of a voltage-dividing circuit 32.

The voltage-dividing circuit 32 includes resistors R11, R12, R13 and R14 connected in series between a high potential power supply Vcc2 and a low potential power supply Vss (0 V). Fuses F11, F12 and F13 which function as switching elements are connected to nodes N11, N12 and N13 of the respective resistors R11 to R14, respectively, and a node N14 of fuses F11, F12 and F13 is connected to the gate of a first transistor TN1. Resistance values of the resistors R11 to R14 are set to the same values as the resistors R6 and R7 of the second embodiment. The resistance values of the resistors R12 and R13 are set to the same values as the resistor R9 of the second embodiment. The resistance values of the respective resistors R11 to R14 may be changed appropriately.

The respective fuses F11 to F13 are selectively blown or broken in accordance with the threshold voltage of the first transistor TN1. The voltage-dividing circuit 32 supplies the gate of the first transistor TN1 with a voltage Vn11 generated by dividing the high potential power supply voltage Vcc2 in accordance with the resistors R11 to R14 selected according to the states of the fuses F11 to F13. The voltage-dividing circuit 32 and the fuses F11 to F13 form a correction circuit 33.

Immediately after the starting circuit 31 is fabricated, the respective fuses F11 to F13 are not broken, but are in the closed-circuit state. At this time, the voltage-dividing circuit 32 supplies the divided voltage Vn11 at which the high potential power supply voltage Vcc2 is divided according to the ratio of resistance values of the resistors R11 to R14. The divided voltage Vn11 rises to equal to or greater than the mean threshold voltage Vthn1 of the first transistor TN1 in proportion to the rise of the high potential power supply voltage Vcc2. Accordingly, regarding the first transistor TN1 having the threshold voltage Vthn1, the starting circuit 31 outputs a starting signal STTZ which falls from the H level to the L level along with lapse of time (rise of the high potential power supply voltage Vcc2).

On one hand, if the transistor TN1 has the maximum threshold voltage Vthn1max, the fuses F12 and F13 are broken. Hereupon, the voltage-dividing circuit 31 supplies the gate of the first transistor TN1 with a divided voltage Vn12 (Vcc2×(R12+R13+R14)/(R11+R12+R13+R14)) generated by dividing the high potential power supply voltage Vcc2 in accordance with the ratio between the resistance value of the resistor R11 and the combined resistance values of the resistors R12 to 14. This divided voltage Vn12 is higher than the divided voltage Vn11 and rises to the maximum threshold voltage Vthn1max.

Thus, the correction circuit 33 adjusts the divided voltage Vn12 in accordance with the maximum threshold voltage Vthn1max of the first transistor TN1. Accordingly, in the first transistor TN1 having the maximum threshold voltage Vthn1max, the starting circuit 31 outputs the starting signal STTZ which changes from the H level to the L level in accordance with the lapse of time (rise of the high potential power supply voltage Vcc2).

If the threshold voltage of the first transistor TN1 varies in value between the maximum threshold voltage Vthn1max and the mean threshold voltage Vthn1, the fuse F13 is broken. Thus, the correction circuit 33 corrects the divided voltage Vn11 in accordance with the threshold voltage of the first transistor TN1.

On the other hand, if the first transistor TN1 has the minimum threshold voltage Vthn1min, the fuses F11 and F12 are broken. Hereupon, the voltage-dividing circuit 32 supplies the gate of the first transistor TN1 with a divided voltage Vn13 (Vcc2×(R14)/(R11+R12+R13+R14)) generated by dividing the high potential power supply voltage Vcc2 in accordance with the ratio between the combined resistance values of the resistors R11 to R13 and the value of resistance of the resistor R14. The divided voltage Vn13 is lower than the divided voltage Vn11 and rises to the minimum threshold voltage Vthn1min. Further, the divided voltage Vn13 slowly rises at a lower rate than the divided voltage Vn11. Accordingly, regarding the first transistor TN1 having the minimum threshold voltage Vthn1min, the starting circuit 31 outputs the starting signal STTZ which falls from the H level to the L level substantially at the same time (time t21 (see FIG. 7)) as when the divided voltage Vn11 is selected.

If the threshold voltage of the first transistor Tn1 varies in value between the maximum threshold voltage Vthn1max and the mean threshold voltage Vthn1, the fuse F11 is broken. Thus, the correction circuit 33 corrects the divided voltage Vn11 in accordance with the threshold voltage of the first transistor TN1.

As described above, according to the starting circuit 31, the fuses F11 to F13 are broken in accordance with the threshold voltage of the first transistor TN1. Accordingly, the divided voltage Vn11 is optimally corrected, and the time at which the first transistor TN1 goes on is set to be later than the time at which the normal initialization of the internal circuit 57 is completed. As a result, even if a low high potential power supply Vcc2 is used, the internal circuit 57 is surely initialized.

It should be apparent to those skilled in the art that the present invention may be embodied in many other specific forms without departing from the spirit or scope of the invention. Particularly, it should be understood that the invention may be embodied in the following forms.

In the aforementioned embodiments, the first transistor TN1 may be a P-channel MOS transistor. In this case, between the high potential power supply Vcc2 and the low potential power supply Vss, the arrangement between a resistor R3 and the first transistor TN1 can be replaced. Further, in the first embodiment, a second transistor TN2 is changed to a P-channel MOS transistor and the P-channel MOS transistor is connected between the high potential power supply Vcc2 and a resistor R4.

In the first embodiment, a plurality of the second transistors TN2 may be connected between a resistor R5 and the low potential power supply Vss. In this case, the value of the sum of the threshold voltages of a plurality of the second transistors TN2 is set to be lower than the threshold voltage of the first transistor TN1.

In the second embodiment, four or more resistors connected in series may also be used instead of three resistors R8 to R10. Nodes between the respective resisters are connected to a node N5 of FIG. 5 via a fuse. Accordingly, the number of divided voltages supplied to a first stage section 53 is changed to three or more.

In the second embodiment, a circuit may also be used instead of the fuses F1 to F4 if the divided voltages Vn3, Vn4 and Vn5 generated in a voltage-dividing circuit 22 and a correction voltage-dividing circuit 23 can be selected. For example, a MOS type transistor may also be used as a switching element.

The present examples and embodiments are to be considered as illustrative and not restrictive and the invention is not to be limited to the details given herein, but may be modified within the scope and equivalence of the appended claims.

What is claimed is:

1. A starting circuit which operates by receiving power from high potential and low potential power supplies, comprising;

a starting signal generation circuit that includes a transistor having a threshold voltage within a predetermined range, wherein the transistor receives a control voltage and produces a starting signal from the time when the high potential power supply voltage starts rising to the time when the control voltage rises to the transistor threshold voltage;

a control voltage generation circuit for dividing the voltage of the high and low potential power supplies and generating the control voltage;

a correction circuit, including a plurality of switching elements, connected between the gate of the transistor and the control voltage generation circuit, for adjusting the control voltage in accordance with the threshold voltage of the transistor; and a waveform shaping circuit, connected to the transistor, for waveform-shaping the starting signal from the transistor and generates a waveform-shaped starting signal.

2. The starting circuit of claim 1, wherein the correction circuit includes:
a first plurality of resistors connected in series between high potential and low potential power supplies, wherein the plurality of switching elements selects one of divided voltages generated by the first plurality of resistors and the control voltage of the control voltage generation circuit and supplies the selected divided voltage to the transistor as the control voltage.

3. The starting circuit of claim 2, wherein the first plurality of resistors include three resistors (R8–R10), and wherein the plurality of switching elements includes:
a first switching element connected between the control voltage generation circuit and the transistor;
second and third switching elements connected in series between a first node between the first and second resistors an a second node between the second and third resistors; and
a switching circuit connected between the transistor and a third node between the second and third switching elements.

4. The starting circuit of claim 3, wherein each switching element includes a fuse, and wherein one of the divided voltages and the control voltage is selected by breaking its fuse.

5. The starting circuit of claim 1, wherein the control voltage generation circuit includes a first plurality of resistors connected in series between the high and low potential power supplies, and wherein the correction circuit includes:
a second plurality of resistors including three resistors connected in series between high potential and low potential power supplies, wherein the plurality of switching elements includes,
a first switching element connected between the control voltage generation circuit and the transistor, and second and third switching elements connected between a first node between the first and second resistors and a second node between the second and third resistors; and
a switching circuit connected between the transistor and a third node between the second and third switching elements.

6. The starting circuit of claim 5, wherein each switching element include a fuse, and wherein the ratio of resistance values of the second plurality of resistors is changed by breaking one of the fuses of the second and third switching elements.

7. The starting circuit of claim 1, wherein the control voltage generation circuit generates a plurality of divided voltages, and wherein the plurality of switching elements selects one of the divided voltages generated by the voltage generation circuit and supplies the selected divided voltage to the transistor as the control voltage.

8. The starting circuit of claim 7, wherein the plurality of divided voltages includes three divided voltages, and wherein the plurality of switching elements includes:
a first switching element selectively providing the first divided voltage with the transistor;
a second switching element selectively providing the second divided voltage with the transistor; and
a third switching element selectively providing the third divided voltage with the transistor.

9. The starting circuit of claim 8, wherein each switching element includes a fuse, and wherein one of the divided voltages is selected by breaking its fuse.

10. The starting circuit of claim 1, wherein the control voltage generation circuit includes a first plurality of resistors including four resistors connected in series between the high and low potential power supplies, and wherein the plurality of switching elements includes;
a first switching element connected between the transistor and a first node between the first and second resistors;
a second switching element connected between the transistor and a second node between the second and third resistors; and
a third switching element connected between the transistor and a third node between the third and fourth resistors.

11. A semiconductor integrated circuit device, comprising:
a starting circuit which operates by receiving power from high potential and low potential power supplies, the starting circuit including;
a starting signal generation circuit that includes a transistor having a threshold voltage within a predetermined range, wherein the transistor receives a control voltage and produces a starting signal from the time when the high potential power supply voltage starts rising to the time when the control voltage rises to the transistor threshold voltage;
a control voltage generation circuit for dividing the voltage of the high and low potential power supplies and generating the control voltage;
a correction circuit, including a plurality of switching elements, connected between the gate of the transistor and the control voltage generation circuit, for adjusting the control voltage in accordance with the threshold voltage of the transistor, and
a waveform shaping circuit, connected to the transistor, for waveform-shaping the starting signal form the transistor and generates a waveform-shaped starting signal; and
an internal circuit, connected to the waveform shaping circuit, for performing the initialization operation in response to the waveform-starting signal.

12. The device of claim 11, wherein the correction circuit adjusts the control circuit adjusts the control voltage so that the time when the control voltage rises to the threshold voltages of the transistor is later than the time when the initialization of the internal circuit is completed.

* * * * *